United States Patent [19]

Suzuki et al.

[11] Patent Number: 4,501,588
[45] Date of Patent: Feb. 26, 1985

[54] INSTANT THREAD DYEING METHOD FOR SEWING MACHINE

[75] Inventors: Ryoichi Suzuki; Yoshio Yamaguchi, both of Tokyo, Japan

[73] Assignee: Janome Sewing Machine Industry Co., Ltd., Japan

[21] Appl. No.: 434,147

[22] Filed: Oct. 13, 1982

[30] Foreign Application Priority Data

Oct. 13, 1981 [JP] Japan ............................ 56-162026

[51] Int. Cl.³ .............................................. D06P 5/20
[52] U.S. Cl. ............................................. 8/444; 8/495; 8/552; 8/553; 8/558; 8/637; 8/918; 8/922; 8/924; 204/159.14; 204/159.15; 204/159.16
[58] Field of Search ................... 8/444, 637, 495, 552, 8/553; 204/159.14, 159.15, 159.16

[56] References Cited

U.S. PATENT DOCUMENTS

| | | | |
|---|---|---|---|
| 3,502,495 | 3/1970 | Akamatsu | 8/444 |
| 3,698,899 | 10/1972 | Giberstein | 8/444 |
| 3,988,108 | 10/1976 | Segoshi et al. | 8/496 |
| 4,239,868 | 12/1980 | Bonnet et al. | 204/159.14 |
| 4,264,483 | 4/1981 | Laufer et al. | 204/159.15 |
| 4,352,672 | 10/1982 | Spiess et al. | 8/444 |

FOREIGN PATENT DOCUMENTS 59-001788  1/1984  Japan .

*Primary Examiner*—A. Lionel Clingman
*Attorney, Agent, or Firm*—William A. Drucker

[57] ABSTRACT

The invention provides a method for instantly dyeing a sewing machine thread without interrupting the stitching operation with a sewing machine. The method comprises the steps of adding a dyestuff and/or pigment to a photo-setting resin solution to prepare a dyeing liquid, applying the dyeing liquid to the thread to be colored and subjecting the thread to irradation of ultraviolet rays for setting the dyeing liquid, thereby forming a colored film on the thread. The photo-setting solution is set or hardened by ultraviolet rays, by radical polymerization, cationic polymerization and cross-linking reaction.

6 Claims, No Drawings

INSTANT THREAD DYEING METHOD FOR SEWING MACHINE

BACKGROUND OF THE INVENTION

The invention relates to an instant thread dyeing method for sewing machines and, more particularly, to a method for instantly dyeing a sewing machine thread with different colors as desired while the thread is used with a sewing machine in stitching operation.

In the prior art it has been necessary to prepare many threads of different colors as required to be used for a stitching operation, especially for making pattern stitches and embroidery stitches with a sewing machine, and to selectively use these threads of different colors in dependence upon the kind of pattern stitches or embroidery stitches. If the sewing machine operator desires to provide a complicated embroidery stitches requiring many different colors according to such conventional manner, the operator is required to interrupt the stitching operation so as to change the sewing thread each time a different colored thread is to be used. Such a thread changing operation is considerably troublesome and time-consuming.

It is therefore desired to provide a method for dyeing a white or colorless thread with any given color without interrupting the stitching operation. However, many difficulties arise in providing such a method which will have to satisfy all of the following requirements;

(a) the thread dyeing treatment must be carried out with a sufficient speed corresponding to a thread consumption speed (i.e., about 1-15 cm/sec.) during the stitching operation;

(b) the thread dyeing treatment will not change the characteristics such as the slidability and flexibility of the thread;

(c) the dyeing effect will be perfect;

(d) the dyeing treatment may be adapted to any kind of threads; and (e) the thread dyeing device must be simple and compact in structure and easy to use.

SUMMARY OF THE INVENTION

It is therefore an object of the invention to provide a novel method for instantly dyeing a thread with a desired color, while locating the thread on a sewing machine and driving the sewing machine for a stitching operation.

Another object of the invention is to provide a method for instantly dyeing a thread used for a stitching operation with a sewing machine, which satisfies all of the aforementioned requirements (a) through (e).

According to an aspect of the invention, there is provided a method for dyeing a sewing machine thread comprising the steps of adding a coloring material to a photo-setting resin solution to prepare a dyeing liquid, applying the dyeing liquid to the thread and irradiating ultraviolet rays to the thread for setting the dyeing liquid on the thread.

DETAILED DESCRIPTION OF THE INVENTION

Prior to discussing the invention, certain of the terms used herein are defined as follows:

(1) "Acryl denatured polyester oligomer" is, for example, an oligomer obtained in 2-hour reaction of acryl acid and phthalic acid-glycidyl alcohol ester with triethylamine added as a polymerization inhibitor in the condition of the reaction temperature of 100°-115° C.

(2) "Acryl denatured epoxy oligomer" is, for example, an oligomer obtained from a reaction of acrylic acid and epoxy resin of epoxy equivalent (140-200) with triethylamine added as a polymerization inhibitor in the condition of the reaction temperature of 90°-95° C.

(3) "Trimethylolpropantriacrylate" is, for example, a composite of trimethylolpropan 1 mol and acrylic acid 3 mol.

(4) "Pigment (phthalocyanine blue)": C.I. (Color Index) Pigment Blue 15 (C.I. 74160) phthalocyanine blue.

(5) "Nonionic surfactant": of a polyoxyethylenealkylphenol type, for example, Eleminol HA-161 (trade name of Sanyo Chemical Co., Ltd).

(6) "Polyethyleneglycoldiacrylate" is, for example, a composite of ethyleneglycol 1 mol and methacrylic acid 2 mol.

(7) "Dyestuff (anthraquinone)": C.I. Disperse Red 1 (C.I. 11110).

(8) "Acryl denatured spirac resin oligomer" is a low molecular oligomer having spiracetal radical, ex. Spirac U-3000 (trade name of Showa Kobunshi Co., Ltd.).

It is necessary that a photo-setting resin solution used for carrying out the method of the invention is hereby defined such that it is set or hardened when being subjected to irradiation of ultraviolet rays. Such a hardening effect is obtained by, for example, radical polymerization, cationic polymerization and cross-linking reaction.

The radical polymerization resin solution is produced in a manner that a radical polymerization type oligomer is diluted with a radical polymerization type monomer to a viscosity of about 300 CPS (centi-poise) or less, and then is incorporated with a photo-polymerization agent which produces a radical in response to irradation with ultraviolet rays.

The radical polymerization type oligomer may be an acrylate like compound oligomer such as polyester, epoxy resin, urethan, alkyd, spirane or the like, each having at the end or side chain of the molecule at least one radical polymerization type functional group, such as acryloil, metha-acryloil and vinyl. Alternatively, the radical polymerization type oligomer may be unsaturated polyester, 1,2-polybutadiene or the like, each including a double bond radical polymerization in the molecular chain.

The radical polymerization type monomer may be a low viscosity monomer or oligomer of one or more functional groups in each molecule. The monomer of single functional group may be 2-hydroxypropylacrylate, 2-hydroxyethylmethacrylate, phenoxypropylacrylate, higher alkylacrylate and methacrylate, and vinylpyrrolidine. The monomer of a plurality of functional groups is, for example, polyhydric alcohol polyacrylate and polymethacrylate such as ethyleneglycol, diethyleneglycol, tripropyleneglycol, butyleneglycol, hexanediol, trimethyrolpropan and pentanerythritol.

The photopolymerization initiator or photo-sensitizer may be benzoinalkylether, 2,2-dimethoxy-2-phenylacetone, 2,2-diethoxyacetonephenone, chlorinated acetophenon derivative, α-acyloximeester, benzophenon, benzil, methylorthobenzoylbenzoate, and thioxanto derivative.

Another type of the photo-setting resin solution may be produced in a manner that a photo-dissolution cation-polymerization initiator is added to an oligomer solution containing epoxy of vinylether radicals. Such an initiator may be aromatic diazonium salt, iodonium salt, sulphonium salt, chromium salt or the like. When the resin solution thus produced is subjected to ultraviolet rays, the oligomer is photopolymerized by a cation to form a film.

The photo-setting resin solution used in the present invention may be of another type. More particularly, a small amount of sensitizer such as 1,2-benzanthraquinone or 2-nitrofluorene is added to a resin solution containing cinnamoyl radical such as a cinnamic acid ester of polyvinylalcohol. The resin solution thus produced is polymerized by cross-linking reaction of cinnamoyl radical when being subjected to ultraviolet rays, thereby being hardened. Alternatively, to a solution of polyamide which is soluble in alcohol such as hexamethyleneadipoamide, hexamethylenesebacoamide and ε-caprolactam is added a cross-linking agent or photopolymerization initiator such as 1,6-bismethacryloilamidehexan, 1,6-bisacryloilamidehexan, N,N'-methylenebismethacrylamide or the like. In this case, cross-linking reaction of chain polyamide molecules takes place by ultraviolet rays.

The photo-setting resin solution used in the present invention of still another type is a hydrosol solution which is produced in a manner that bichromate or diazo-compound is added to a colloidal solution of organic macromolecule such as gum arabic, starch, albumen, gelatine, and polyvinylalcohol. The hydrosol solution thus produced is hardened by irradiation of ultraviolet rays.

A plasticizer, elastic polymer and surfactant may be preferably added to the resin solution.

To the resin solution described above is added a dyestuff and/or pigment to produce a coloring liquid, and the coloring liquid is applied to the thread to be colored. This is preferably done in such manner that the thread is passed between two-layered porous material (e.g., felt and sponge) which has been soaked with the coloring liquid. The thread with the coloring liquid thinly and uniformly coated thereon is thereafter subjected to irradation of ultraviolet rays (wavelength of about 200–400 mμ) for about 0.1 to 20 seconds. A sterilizing lamp, high-pressure mercury lamp, carbon arc lamp, xenon lamp or the like may be used to produce ultraviolet rays.

The following examples describe the preferred manners and modes contemplated by the inventors for carrying out the method of the present invention. However, it is to be understood that the present invention is not limited to the following examples except as defined in the appended claims.

EXAMPLE 1

The coloring liquid was prepared by the following compositions and then applied to a nylon thread.
acryl denatured polyester oligomer: 20 weight-part
acryl denatured epoxy oligomer: 10 weight-part
trimethyl or propantriacrylate: 50 weight-part
benzoinethylether: 7 weight-part
pigment (phtalocyanine blue): 15 weight-part
nonionic surfactant: 1 weight-part
The nylon thread was then subjected to irradation of a high pressure mercury lamp for 5 seconds to harden the liquid, thereby forming a colored film on the thread.

EXAMPLE 2

The coloring liquid was produced by the following compositions and applied to a cotton thread.
polyethyleneglycoldiacrylate: 60 weight-part
celluloseacetatebutylate: 5 weight-part
benzophenone: 9 weight-part
linseed oil: 10 weight-part
dyestuff (anthraquinone): 8 weight-part
nonionic surfactant: 1 weight-part
The cotton thread was subjected to irradation of a high pressure mercury lamp for 7 seconds to harden the liquid, thereby forming a film on the thread.

EXAMPLE 3

The coloring liquid was prepared by the following composition and applied to a polyester thread.
acryl denatured spirac resin oligomer: 20 weight-part
ethyleneglycolmonoacrylate: 50 weight-part
benzoinmethylether: 7 weight-part
dibutyl phthalate: 5 weight-part
pigment (phtalocyanine blue): 15 weight-part
nonionic surfactant: 1 weight-part
The irradation of a high pressure mercury lamp for 5 seconds was sufficient for hardening the liquid.

In each example, it was possible to produce a well-colored thread and stitch a colorful design by using the thread which was colored with a given color according to the method of the present invention. Moreover, the colored thread produced according to the invention showed a satisfactory degree of finished effect.

What is claimed is:

1. A method for dyeing a sewing machine thread which is continuously supplied for a stitching operation, comprising the steps of:
   (a) adding a coloring material to a photo-setting resin solution to prepare a dyeing liquid,
   (b) continuously supplying a thread for a stitching operation
   (c) applying said dyeing liquid to said continuously supplied thread, and
   (d) irradiating said thread with ultraviolet rays for setting said dyeing liquid on said thread.

2. The method of claim 1 wherein said resin solution has such property that it is photopolymerized by radical polymerization.

3. The method of claim 1 wherein said resin solution has such property that it is photopolymerized by cationic polymerization.

4. The method of claim 1 wherein said resin solution has such property that it is photopolymerized by cross-linking reaction.

5. The method of claim 1 wherein said resin solution has a viscosity of at most about 300 CPS.

6. A method for dyeing a sewing machine thread which is continuously supplied for a stitching operation, comprising the steps of:
   (a) adding a coloring material to a photo-setting resin solution to prepare a dyeing liquid,
   (b) providing said sewing machine thread,
   (c) applying said dyeing liquid to said sewing machine thread,
   (d) irradiating said dyeing liquid after application to said thread with ultraviolet rays for setting said dyeing liquid on said thread,
   (e) said coloring material being one of pigment 5–30 parts by weight and dyestuff 4–12 parts by weight, and said photo-setting resin solution being taken from the class consisting of acryl denatured epoxy oligomer 3–20 parts by weight, trimethyl or propantriacrylate 20–60 parts by weight, polyethylene glycol diacrylate 40–75 parts by weight, acryl denatured spirac resin oligomer 7–35 parts by weight and ethylene glycol monoacrylate 20–60 parts by weight and combinations thereof.

* * * * *